US012756162B2

(12) United States Patent
Matsumura

(10) Patent No.: US 12,756,162 B2
(45) Date of Patent: Oct. 6, 2026

(54) HIGH VOLTAGE DISTRIBUTION BOX WITH HEAT SINK

(71) Applicant: Sumitomo Wiring Systems, Ltd., Yokkaichi (JP)

(72) Inventor: Max Matsumura, Farmington Hills, MI (US)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 244 days.

(21) Appl. No.: 18/776,956

(22) Filed: Jul. 18, 2024

(65) Prior Publication Data

US 2026/0024964 A1 Jan. 22, 2026

(51) Int. Cl.

| | |
|---|---|
| ***H05K 7/20*** | (2006.01) |
| ***H02B 1/50*** | (2006.01) |
| ***H02B 1/56*** | (2006.01) |
| ***H10W 40/60*** | (2026.01) |
| *H01R 4/30* | (2006.01) |

(52) U.S. Cl.

CPC ................. *H02B 1/56* (2013.01); *H02B 1/50* (2013.01); *H05K 7/2089* (2013.01); *H10W 40/613* (2026.01); *H01R 4/30* (2013.01)

(58) Field of Classification Search

None

See application file for complete search history.

(56) References Cited

U.S. PATENT DOCUMENTS 4,546,408 A * 10/1985 Rodseth ................. H05K 3/325 361/720
5,065,280 A * 11/1991 Karnezos ............... H05K 3/365 361/705
5,590,026 A * 12/1996 Warren ............... H10W 40/611 257/E23.084
5,777,844 A * 7/1998 Kiefer .................... H05K 7/142 361/720

(Continued)

FOREIGN PATENT DOCUMENTS

CN 114360965 A 4/2022
KR 101433004 B1 8/2014

OTHER PUBLICATIONS

Design Guide: Use of THT High Current Wire Connectors with IMS PCB Utilizing Hybrid THT and SMT (SMD) with Insulated Metal Substrate (Metal Core) IMS PCB and Heat Sink Cooling, Feb. 7, 2024, lugsdirect.com.

*Primary Examiner* — Courtney L Smith
(74) *Attorney, Agent, or Firm* — Brooks Kushman P.C.

(57) ABSTRACT

A high voltage distribution box includes a case housing a bus bar, a sheet of metal and a heat sink. The bus bar includes a first aperture. The sheet of material includes a second aperture registered to the first aperture. The heat sink is disposed in the case and includes a protrusion extending toward the bus bar. The protrusion includes a third aperture registered to the first aperture and the second aperture and the sheet of material is interposed between the protrusion and the bus bar. The high voltage distribution box further includes a fastener disposed within the first aperture, the (Continued)

second aperture and the third aperture. The fastener is configured to receive a bolt so as to secure the bus bar to the protrusion and has a thickness and a height greater than an arc potential so as to prevent an arc from occurring.

20 Claims, 4 Drawing Sheets

(56) References Cited

U.S. PATENT DOCUMENTS

| | | | | |
|---|---|---|---|---|
| 7,050,305 | B2 * | 5/2006 | Thorum | H05K 5/15 174/16.3 |
| 7,619,896 | B2 | 11/2009 | Yamashita et al. | |
| 8,130,499 | B2 * | 3/2012 | Ohnishi | H10W 40/255 174/16.3 |
| 8,339,772 | B2 | 12/2012 | Peralta et al. | |
| 10,170,900 | B2 * | 1/2019 | Yamane | H01F 27/2828 |
| 10,314,204 | B2 * | 6/2019 | Ritter | H05K 1/0203 |
| 11,056,864 | B2 | 7/2021 | Sasaki et al. | |
| 11,744,046 | B2 * | 8/2023 | Matsuda | H05K 7/20445 361/679.32 |
| 11,839,068 | B2 * | 12/2023 | Ono | H02B 1/48 |
| 2013/0028683 | A1 * | 1/2013 | I | B60R 16/0238 411/166 |
| 2020/0136326 | A1 * | 4/2020 | Rai | H01H 50/12 |
| 2021/0319933 | A1 | 10/2021 | Beaupre et al. | |
| 2024/0057294 | A1 * | 2/2024 | Yanagida | H05K 7/20445 |

* cited by examiner

HIGH VOLTAGE DISTRIBUTION BOX WITH HEAT SINK

TECHNICAL FIELD

The present specification generally relates to high voltage distribution box having a heat sink and more particularly to a high voltage distribution box including a fastener for preventing an electric arc from occurring.

BACKGROUND

In general, a high voltage distribution box is used in a platform, such as an automotive vehicle, to distribute power throughout the vehicle. The high voltage distribution box includes a housing enclosed by a top cover. The housing holds electric components which are configured to distribute power from a power source, such as a battery to electric component throughout the vehicle.

The operation of the electric components may generate heat. As such, the high voltage distribution box may include a heat sink for dissipating heat from the interior of the housing. In some instances, the heat sink is not only thermally conductive but is also electrically conductive. In such an aspect, a current may be conducted by the heat sink. To overcome this, a sheet of material is interposed between the heat sink and a conductive element such as a bus bar. The sheet of material is secured between the heat sink and the bus bar by a pinch fit engagement. Thus, the sheet of material may be removed or otherwise displaced in the event that the pinch fit engagement becomes loose. This may occur as a result of vibrational loads generated during the operation of the vehicle.

In other aspects, the bus bar is fastened to the heat sink using a bolt which is screwed into a hole of the bus bar. Thus, though the sheet of material is fixed between bus bar and the heat sink, the hole present an exposed electrically conductive surface, wherein an electrical arc may occur.

Accordingly, it remains desirable to have a high voltage distribution box configured to secure the sheet of material between the bus bar and the heat sink and prevent an electrical arc from occurring.

SUMMARY

In one aspect, a high voltage distribution box is provided. The high voltage distribution box is configured to dissipate heat and prevent an electrical arc from occurring. The high voltage distribution box includes a case, a bus bar, a sheet of material, a top cover, a bottom cover and a heat sink. The case includes an open bottom opposite of an open top. The bus bar includes a first aperture. The sheet of material is disposed on the bus bar and includes a second aperture registered to the first aperture. The top cover and the bottom cover are configured to close the open top and the open bottom of the case respectively. The heat sink is disposed on one of the top cover and bottom cover. The heat sink includes a protrusion extending toward the bus bar. The protrusion includes a third aperture registered to the first aperture and the second aperture, wherein the sheet of material is interposed between the protrusion and the bus bar. The high voltage distribution box further includes a fastener disposed within the first aperture, the second aperture and the third aperture, the fastener configured to receive a bolt so as to secure the bus bar to the protrusion.

The electric junction box may include one or more of the following optional features. For example, in one aspect, the sheet of material may be formed of a material that is both thermally conductive and electrically insulating and the fastener may be formed of an electrically insulating material.

In another aspect, the fastener includes an open end and a closed end opposite the open end. Optionally, the fastener may include a tubular base and a head portion having a diameter greater than a diameter of the tubular base.

In one aspect, the tubular base has a thickness and a height greater than an arc potential so as to prevent an arc from occurring. In such an aspect, the tubular base extends through the first aperture, the second aperture and the third aperture and the head portion is pressed against a bottom surface of the bus bar.

In one aspect, the fastener may further include a fin disposed on a top surface of the head portion, wherein the fin extends radially from an outer surface of the tubular base.

In one aspect, the head portion may include an end cap and a flange. In such an aspect, the flange separates the end cap from the tubular base. In such an aspect, the head portion may further include a rib disposed on a bottom surface of the flange and extending radially from the end cap.

In one aspect of the high voltage distribution box, the high voltage distribution box may further include an electric device in electrical contact with the bus bar. For instance, the electric device may be a relay switch.

In yet another aspect of the disclosure, a fastener is provided. The fastener may be configured to be used in a high voltage distribution box. The high voltage distribution box may include a case having an open bottom opposite of an open top, a bus bar having a first aperture in electrical connection with a relay, wherein the bus bar and the relay disposed in the case. The high voltage distribution box may further include a sheet of material having a second aperture registered to the first aperture, and a heat sink. The heat sink includes a protrusion extending toward the bus bar. The protrusion includes a third aperture registered to the first aperture and the second aperture, wherein the sheet of material is interposed between the protrusion and the bus bar. The fastener includes a tubular base and a head portion having a diameter greater than a diameter of the tubular base, wherein the tubular base is disposed within the first aperture, the second aperture and the third aperture, and wherein the tubular base is configured to receive a bolt so as to secure the bus bar to the protrusion. Further, the tubular base has a thickness and a height greater than an arc potential so as to prevent an arc from occurring.

In one aspect, the fastener is formed of an electrically insulating material.

In another aspect, the fastener includes an open end and a closed end opposite the open end. In such an aspect, the head portion is pressed against a bottom surface of the bus bar. Optionally, the fastener may further include a fin disposed on a top surface of the head portion and extending radially from an outer surface of the tubular base.

In one aspect, the head portion includes an end cap and a flange, the flange separating the end cap from the tubular base. In such an aspect, the head portion further includes a rib disposed on a bottom surface of the flange and extending radially from the end cap. Optionally, fastener may include a plurality of fins and a plurality of ribs.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

FIG. 3 is a cross-sectional view of the high voltage distribution box taken along line 3-3.

DETAILED DESCRIPTION OF PREFERRED EMBODIMENTS

Figure 1:
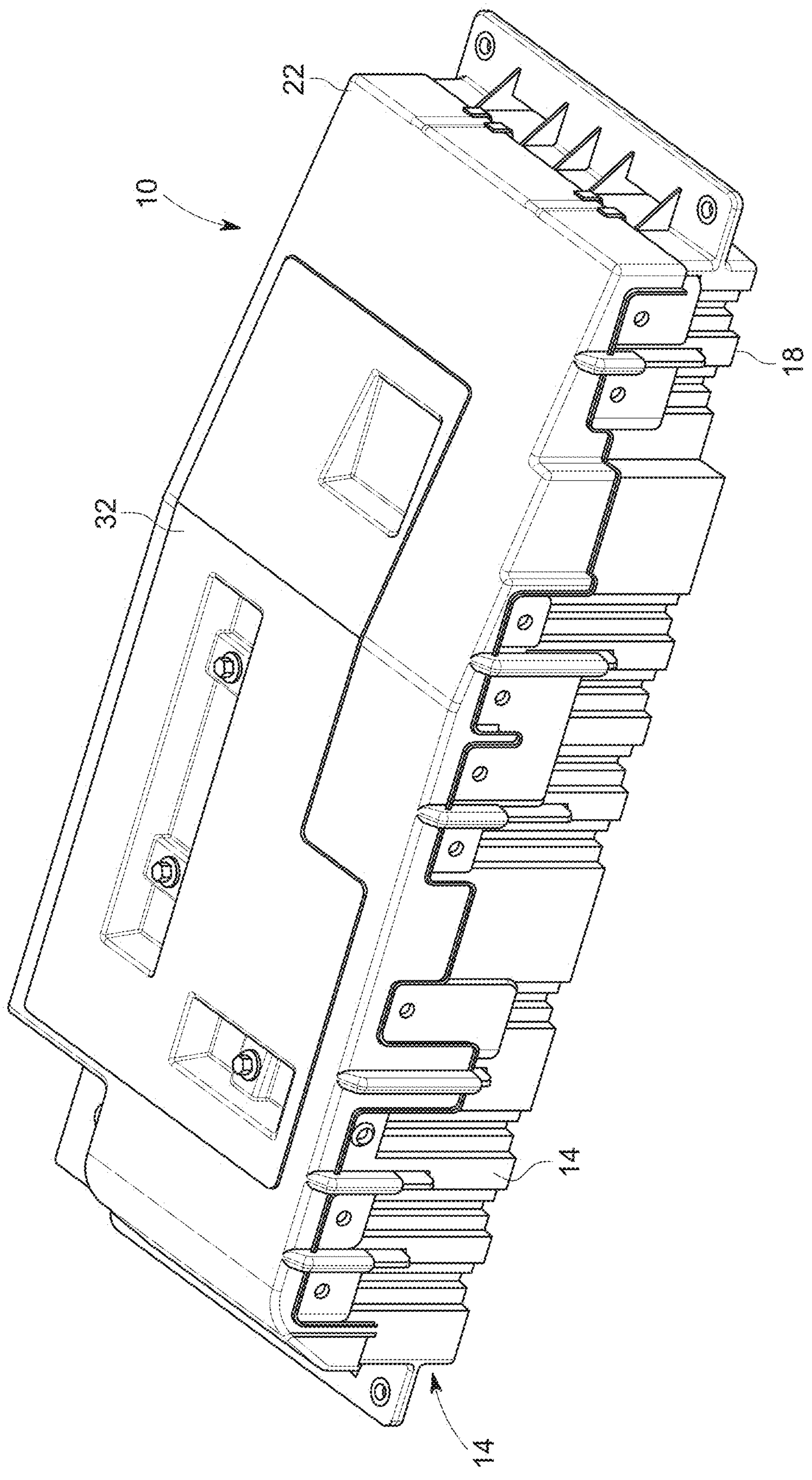
FIG. 1 is an exemplary depiction of a high voltage distribution box according to one or more embodiments illustrated herein.

Example configurations will now be described more fully with reference to the accompanying drawings. Example configurations are provided so that this disclosure will be thorough, and will fully convey the scope of the disclosure to those of ordinary skill in the art. Specific details are set forth such as examples of specific components, devices, and methods, to provide a thorough understanding of configurations of the present disclosure. It will be apparent to those of ordinary skill in the art that specific details need not be employed, that example configurations may be embodied in many different forms, and that the specific details and the example configurations should not be construed to limit the scope of the disclosure.

The terminology used herein is for the purpose of describing particular exemplary configurations only and is not intended to be limiting. As used herein, the singular articles "a," "an," and "the" may be intended to include the plural forms as well, unless the context clearly indicates otherwise. The terms "comprises," "comprising," "including," and "having," are inclusive and therefore specify the presence of features, steps, operations, elements, and/or components, but do not preclude the presence or addition of one or more other features, steps, operations, elements, components, and/or groups thereof. The method steps, processes, and operations described herein are not to be construed as necessarily requiring their performance in the particular order discussed or illustrated, unless specifically identified as an order of performance. Additional or alternative steps may be employed.

When an element or layer is referred to as being "on," "engaged to," "connected to," "attached to," or "coupled to" another element or layer, it may be directly on, engaged, connected, attached, or coupled to the other element or layer, or intervening elements or layers may be present. In contrast, when an element is referred to as being "directly on," "directly engaged to," "directly connected to," "directly attached to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/of" includes any and all combinations of one or more of the associated listed items.

Referring generally to the figures, embodiments of the present disclosure include a high voltage distribution box including a case housing a bus bar, a sheet of metal and a heat sink. The bus bar includes a first aperture. The sheet of material is interposed between the bus bar and the heat sink. The sheet of material includes a second aperture registered to the first aperture. The heat sink is disposed in the case and includes a protrusion extending toward the bus bar. The protrusion includes a third aperture registered to the first aperture and the second aperture and the sheet of material is interposed between the protrusion and the bus bar. The high voltage distribution box further includes a fastener disposed within the first aperture, the second aperture and the third aperture. The fastener is configured to receive a bolt so as to secure the bus bar to the protrusion and has a thickness and a height greater than an arc potential so as to prevent an arc from occurring. In particular, the exposed metal of the bus bar defined by the first aperture is distanced from the metal bolt sufficiently to prevent an electrical arc from occurring.

With reference now to FIG. 1, a high voltage distribution box 10 is provided. The high voltage distribution box 10 is configured to distribute power from a power source (not shown) such as a battery to various loads (not shown). In one aspect, the high voltage distribution box 10 is used in an automotive vehicle (not shown). The high voltage distribution box 10 includes a plurality of electric components 12 (see FIG. 2) which are configured to distribute electrical power such as relays, fuses and the like. Such electric components 12 generate heat, which may damage some of the other electric components 12.

Figure 2:
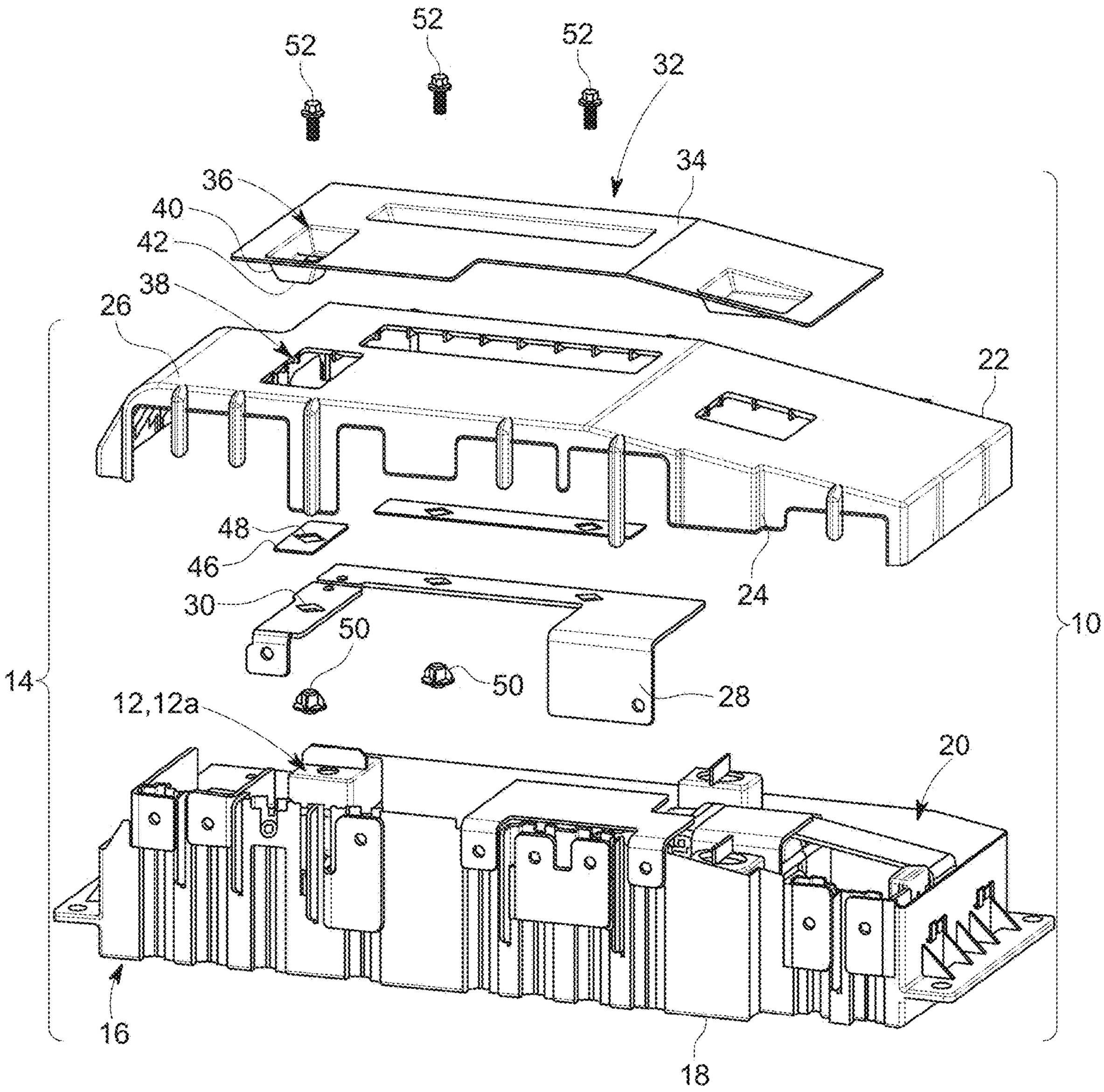
FIG. 2 is an exploded view of the high voltage distribution box shown in FIG. 1.

With reference again to FIG. 1 and now to FIG. 2, the high voltage distribution box 10 includes a case 14. The case 14 is a generally cuboidal box shape having a frame 16 defining the sidewalls and end walls of the case 14. The frame 16 includes a closed bottom 18 opposite of an open top 20. The high voltage distribution box 10 further includes a top cover 22 mounted to the frame 16 and configured to close the open top 20. The top cover 22 is a generally planar sheets of material and may include a plurality of side portions 24 extending downwardly from a planar top portion 26. In such an aspect, the frame 16 is dimensioned with structure configured to receive the side portions 24 so as to fit the top cover 22 onto the frame 16. The frame 16 and the top cover 22 may be formed of a material suitable for injection molding, illustratively including polypropylene, Acrylonitrile butadiene styrene, polyoxymethylene, polycarbonate and the like.

Figure 3:
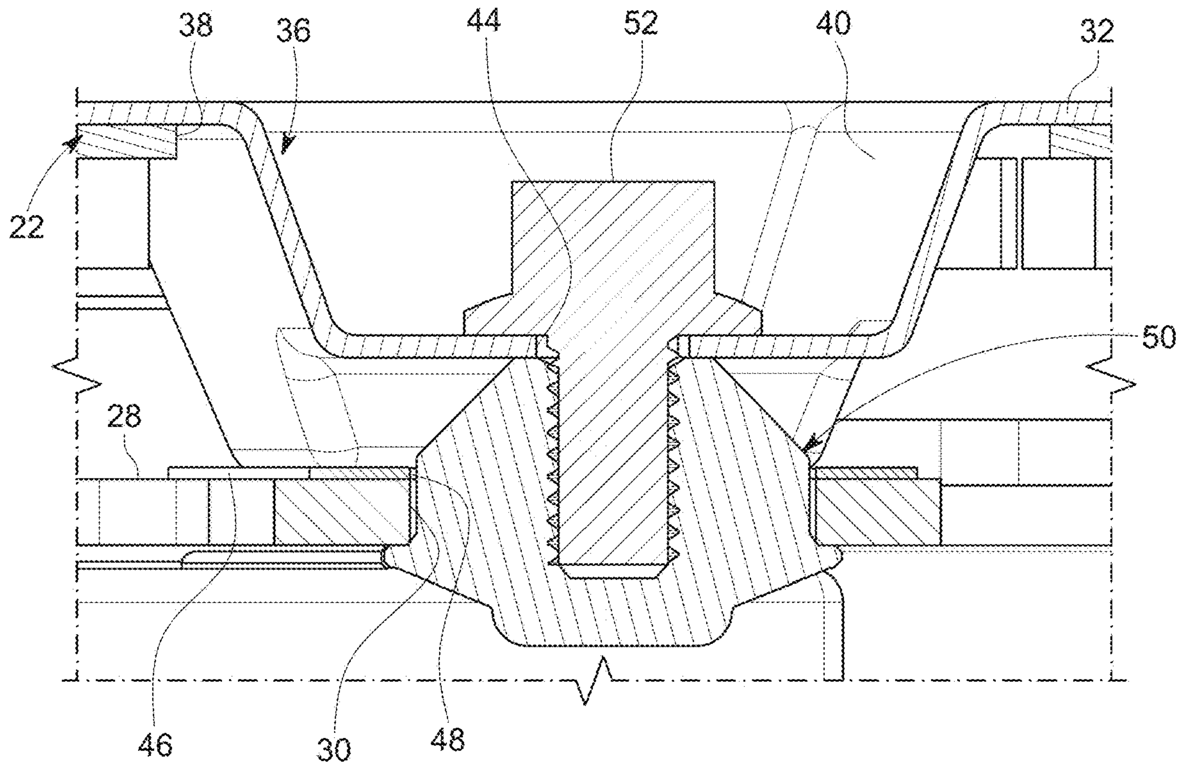
FIG. 3 is a perspective view of the high voltage distribution box shown in FIG. 1 with the top cover and bottom cover removed.
Figure 4:
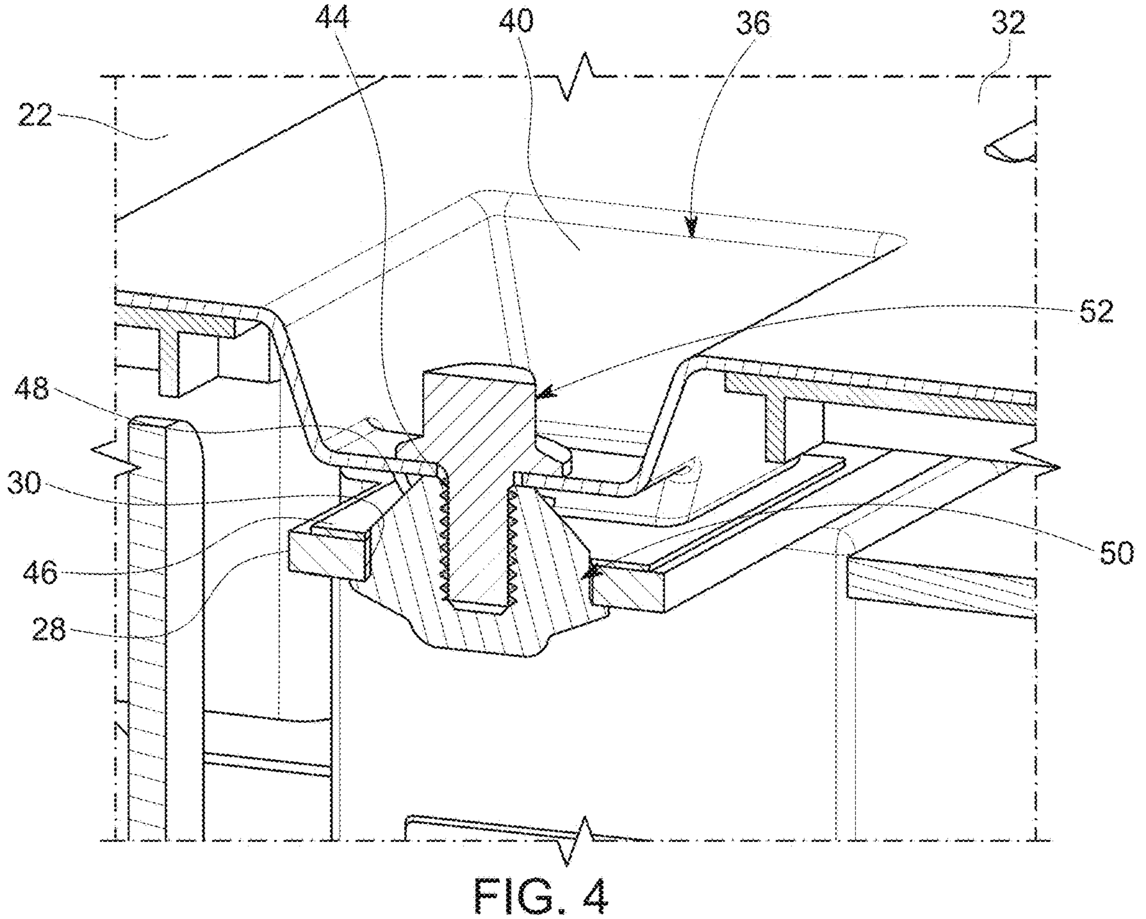
FIG. 4 is a perspective view of FIG. 3.

With reference again to FIG. 2 and now to FIGS. 3 and 4, the high voltage distribution box 10 further includes a bus bar 28. The bus bar 28 is a planar member formed of an electrically and thermally conductive material. The high voltage distribution box 10 may include a plurality of bus bars 28 that are connected to a plurality of electric components 12. The bus bar 28 includes a first aperture 30 extending though the bus bar 28. The bus bars 28 are configured to route power power from one end of the case 14 to another end of the case 14. One of the bus bars 28 is electrically connected to an electric component 12 that is configured to generate heat, such as a relay switch **12*a*. In one aspect, the relay switch 12*a* is disposed underneath the bus bar 28. In such a context, when the relay switch 12*a* is turned on an electrical current is passed through the bus bar 28 and heat generated by the relay switch 12*a* is conducted by the bus bar 28. During the operation of the relay switch 12*a*, the heat generated by the relay switch 12*a* may cumulate especially at the area in which the bus bar 28 is attached to the relay switch 12*a***.

With reference again to FIGS. 2-4, the high voltage distribution box 10 further includes a heat sink 32. The heat sink 32 is disposed on an outer surface of one of the top cover 22 and the closed bottom 18 of the case 14. The heat sink 32 is formed of a thermally conductive material, such as stainless steel. The heat sink 32 is a sheet of material having a main portion 34 that is planar and includes a protrusion 36 extending toward the bus bar 28. The heat sink 32 is disposed on one of the top cover 22 and closed bottom 18. The top cover 22 and the closed bottom 18 includes an opening 38 for receiving the protrusion 36. For illustrative purposes, the opening 38 is shown as having a rectangular shape.

For illustrative purposes, the heat sink 32 is shown disposed on the top cover 22. However, the principles described herein may be applicable to an aspect where the heat sink 32 is disposed on the closed bottom 18. The heat sink 32 is configured to dissipate heat generated within the case 14. The heat sink 32 includes a planar sheet of electrically conductive material. Accordingly, the heat sink 32 may not only conduct heat but also electricity. In aspects where the heat sink 32 is disposed on the top cover 22, the main portion 34 of the heat sink 32 rests against a top surface of the top cover 22 and the protrusion 36 is seated within an opening 38 and extends downwardly from a top surface of the top cover 22 towards the bus bar 28. In aspects where the heat sink 32 is disposed on the closed bottom 18 (not shown), the main portion 34 of the heat sink 32 rests against a bottom surface of the closed bottom 18 and the protrusion 36 is seated within the opening 38 and extends upwardly from a bottom surface of the closed bottom 18 towards the bus bar 28.

In one aspect, the protrusion 36 is integrally formed to the top cover 22. In one aspect, the protrusion 36 is formed by walls 40 which extend from the planar sheet of the top cover 22 toward the bus bar 28. It should be appreciated that the walls 40 and the top cover 22 are formed of the same material. In aspects where the protrusion 36 is formed on the closed bottom 18, the walls 40 are integral to the closed bottom 18. The protrusion 36 includes a contact surface 42 which is generally planar and disposed on a distal end of the walls. The contact surface 42 is configured to be seated against the bus bar 28. The protrusion 36 includes a second aperture 44 disposed on the contact surface 42. The second aperture 44 is registered to the first aperture 30 and the second aperture 44. In particular, the second aperture 44 is disposed on the distal end of the protrusion 36. As shown in the Figures, the heat sink 32 may include one or more protrusion 36*s*, in which case 14 the top cover 22 and the closed bottom 18 may include a corresponding number of openings 38.

With reference again to FIG. 2 and now to FIG. 3, the high voltage distribution box 10 further includes a sheet of material 46. The sheet of material 46 is interposed between the bus bar 28 and the protrusion 36 and includes a third aperture 48 registered to the first aperture 30 and the second aperture 44. The sheet of material 46 is formed of a material that is both thermally conductive and electrically insulating. Such a material illustratively includes a material commonly referenced as Thermal Interface Material. The sheet of material 46 is configured to cover the entirety of a bottom surface of the protrusion 36 so as to prevent electricity from the bus bar 28 from being transmitted to the heat sink 32. In one aspect, the sheet of material 46 has a width which is the same as the width of the bus bar 28.

Figure 5:
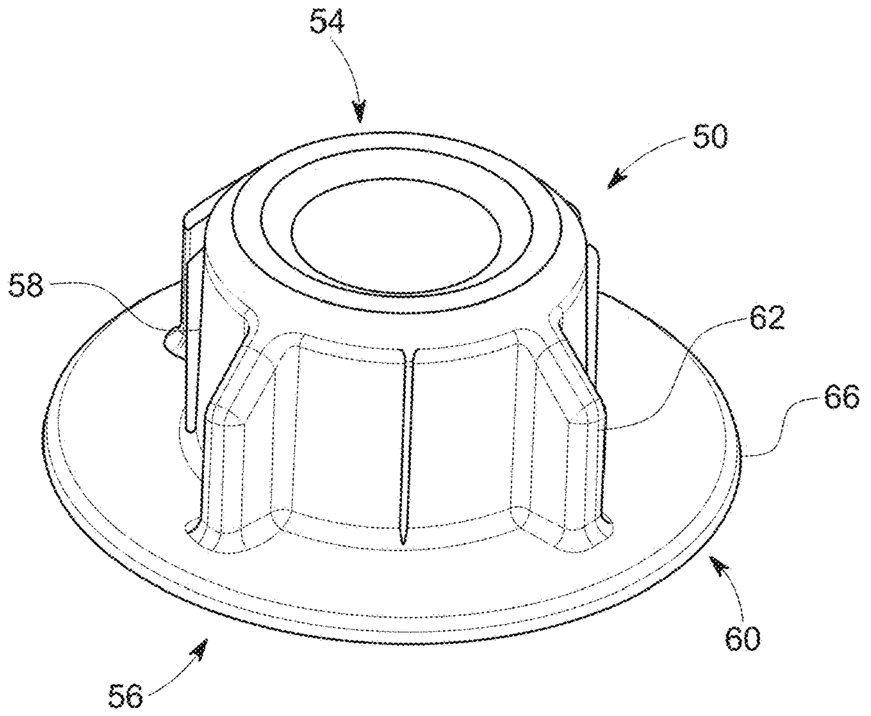
FIG. 5 is perspective view of the spacer taken from the top.
Figure 6:
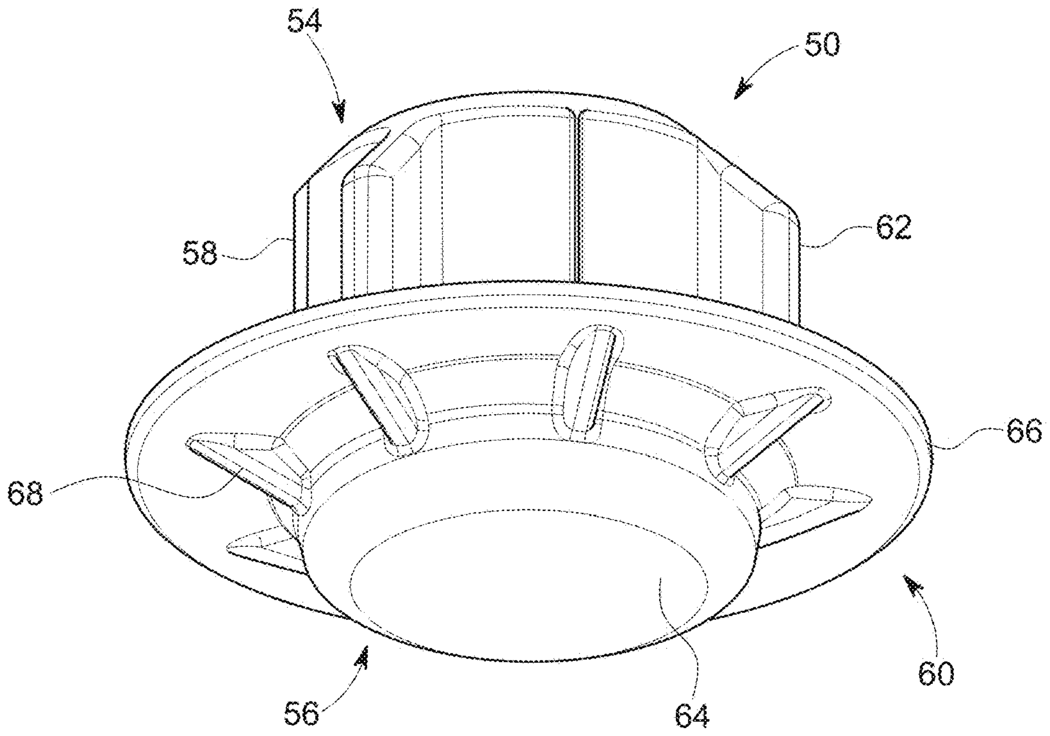
FIG. 6 is a perspective view of the spacer taken from the bottom.

With reference again to FIG. 2 and now to FIGS. 5-6, the high voltage distribution box 10 further includes a fastener 50. The fastener 50 is disposed within the first aperture 30, the second aperture 44 and the third aperture 48. The fastener 50 is configured to receive a bolt 52 so as to secure the bus bar 28 to the protrusion 36 with the sheet of material 46 interposed therebetween. The fastener 50 is formed on an electrically insulating material, such as a natural or synthetic rubber.

The fastener 50 includes an open end 54 and a closed end 56 opposite the open end 54. The open end 54 may be threaded and configured to receive a threaded shaft of the bolt 52. The fastener 50 may include a tubular base 58 defining the open end 54 and a head portion 60 defining the closed end 56. The head portion 60 has a diameter greater than a diameter of the tubular base 58. The tubular base 58 has a thickness and a height greater than an arc potential so as to prevent an electrical arc from occurring. In assembly, the tubular base 58 extends through the first aperture 30, the second aperture 44 and the third aperture 48 and the head portion 60 is pressed against a bottom surface of the bus bar 28.

In one aspect, the fastener 50 may further include a fin 62 disposed on a top surface of the head portion 60. For illustrative purposes, the fastener 50 is shown as having four (4) fins 62. Each fin 62 is a planar member that extends radially from an outer surface of the tubular base 58. The head portion 60 may include an end cap 64 and a flange 66. The flange 66 separates the end cap 64 from the tubular base 58 and the fin 62 extends radially along a top surface of the flange 66. The head portion 60 may further include a rib 68 disposed on a bottom surface of the flange 66 and extending radially from the end cap 64. For illustrative purposes, the fastener 50 is shown as having eight (8) fins 62.

With reference again to FIG. 3 and now to FIG. 4, a description of the operation of the high voltage distribution box 10 is provided. The heat sink 32 is shown disposed on the top cover 22 of the case 14 and wherein the protrusion 36 extends downwardly towards the bus bar 28. The sheet of material 46 is interposed between the distal end of the protrusion 36 and the bus bar 28. Accordingly, an electric current that runs through the bus bar 28 is insulated by the sheet of material 46 so as to prevent the electric current from running through the heat sink 32.

The fastener 50 is disposed within the first aperture 30, the second aperture 44 and the third aperture 48 of the corresponding bus bar 28, sheet of material 46 and the heat sink 32. In particular, the tubular shaft is fitted into the first aperture 30, the second aperture 44 and the third aperture 48 and the flange 66 is pushed up against the bottom surface of the bus bar 28. A bolt 52 is fitted into the tubular shaft of the fastener 50, thereby securing the heat sink 32 to the bus bar 28.

In such a manner, the sheet of material 46 is pressed between the bus bar 28 and the heat sink 32. However, as the first aperture 30 extends through the bus bar 28, metal is exposed. When current runs through the bus bar 28, the electrolyzed bus bar 28 may create an arc potential electrolyzing the bolt 52. However, a thickness of the tubular shaft is dimensioned to create enough space between the exposed metal of the first aperture 30 and the bolt 52 to prevent an electrical arc from forming. Accordingly, the high voltage distribution box 10 disclosed herein facilitates heat dispersion while preventing an electric arc from being generated.

While particular embodiments have been illustrated and described herein, it should be appreciated and understood that various other changes and modifications may be made without departing from the spirit and scope of the claim subject matter. Moreover, although various aspects of the claim subject matter have been described herein, such aspects need not be utilized in combination. It is therefore intended that the appended claims cover all such changes and modifications that are within the scope of the claim subject matter.

While particular embodiments have been illustrated and described herein, it should be appreciated and understood that various other changes and modifications may be made without departing from the spirit and scope of the claim subject matter. Moreover, although various aspects of the claim subject matter have been described herein, such aspects need not be utilized in combination. It is therefore intended that the appended claims cover all such changes and modifications that are within the scope of the claim subject matter.

The invention claimed is:

1. A high voltage distribution box comprising:

a case having an open bottom opposite of an open top;

a bus bar including a first aperture;

a sheet of material disposed on the bus bar, the sheet of material including a second aperture registered to the first aperture; and a top cover and a bottom cover configured to close the open top and the open bottom respectively;

a heat sink disposed on one of the top cover and bottom cover, the heat sink including a protrusion extending toward the bus bar, the protrusion including a third aperture registered to the first aperture and the second aperture, wherein the sheet of material is interposed between the protrusion and the bus bar; and a fastener disposed within the first aperture, the second aperture and the third aperture, the fastener configured to receive a bolt so as to secure the bus bar to the protrusion.

2. The high voltage distribution box as set forth in claim 1, wherein the sheet of material is formed of a material that is both thermally conductive and electrically insulating.

3. The high voltage distribution box as set forth in claim 1, wherein the fastener is formed of an electrically insulating material.

4. The high voltage distribution box as set forth in claim 1, wherein the fastener includes an open end and a closed end opposite the open end.

5. The high voltage distribution box as set forth in claim 1, wherein the fastener includes a tubular base and a head portion having a diameter greater than a diameter of the tubular base.

6. The high voltage distribution box as set forth in claim 5, wherein the tubular base has a thickness and a height greater than an arc potential so as to prevent an arc from occurring.

7. The high voltage distribution box as set forth in 5, wherein the tubular base extends through the first aperture, the second aperture and the third aperture and the head portion is pressed against a bottom surface of the bus bar.

8. The high voltage distribution box as set forth in claim 5, wherein the fastener further includes a fin disposed on a top surface of the head portion and extending radially from an outer surface of the tubular base.

9. The high voltage distribution box as set forth in claim 5, wherein the head portion includes an end cap and a flange, the flange separating the end cap from the tubular base.

10. The high voltage distribution box as set forth in claim 9, wherein the head portion further includes a rib disposed on a bottom surface of the flange and extending radially from the end cap.

11. The high voltage distribution box as set forth in claim 1, further including an electric device in electrical contact with the bus bar.

12. The high voltage distribution box as set forth in claim 11, wherein the electric device is a relay switch.

13. A fastener for use in a high voltage distribution box, the high voltage distribution box including a case having an open bottom opposite of an open top, a bus bar in electrical connection with a relay, the bus bar and the relay disposed in the case, the bus bar including a first aperture; a sheet of material including a second aperture registered to the first aperture, and a heat sink including a protrusion extending toward the bus bar, the protrusion including a third aperture registered to the first aperture and the second aperture, wherein the sheet of material is interposed between the protrusion and the bus bar a fastener comprising:

a tubular base and a head portion having a diameter greater than a diameter of the tubular base, the tubular base disposed within the first aperture, the second aperture and the third aperture, wherein the tubular base is configured to receive a bolt so as to secure the bus bar to the protrusion, and wherein the tubular base has a thickness and a height greater than an arc potential so as to prevent an arc from occurring.

14. The fastener as set forth in claim 13, wherein the fastener is formed of an electrically insulating material.

15. The fastener as set forth in claim 13, wherein the fastener includes an open end and a closed end opposite the open end.

16. The fastener as set forth in 15, wherein the head portion is pressed against a bottom surface of the bus bar.

17. The fastener as set forth in claim 16, further including a fin disposed on a top surface of the head portion and extending radially from an outer surface of the tubular base.

18. The fastener as set forth in claim 17, wherein the head portion includes an end cap and a flange, the flange separating the end cap from the tubular base.

19. The fastener as set forth in claim 18, wherein the head portion further includes a rib disposed on a bottom surface of the flange and extending radially from the end cap.

20. The fastener as set forth in claim 19, wherein the fin is a plurality of fins and the rib is a plurality of ribs.

* * * * *